United States Patent [19]

Sato

[11] Patent Number: 5,753,926
[45] Date of Patent: May 19, 1998

[54] SCAN TYPE EXPOSURE APPARATUS AND METHOD HAVING A REFERENCE PLATE WITH MARKS FOR IMAGE DETECTION

[75] Inventor: Mitsuya Sato, Yokohama, Japan

[73] Assignee: Canon Kabushiki Kaisha, Tokyo, Japan

[21] Appl. No.: 634,988

[22] Filed: Apr. 19, 1996

[51] Int. Cl.$^6$ .................................................. G01N 21/86
[52] U.S. Cl. ..................... 250/548; 250/559.3; 356/400; 355/55
[58] Field of Search ................................. 250/548, 559.3, 250/559.29; 356/399–401; 355/53–55

[56] References Cited

U.S. PATENT DOCUMENTS

| | | | |
|---|---|---|---|
| 4,659,227 | 4/1987 | Sato et al. | 356/401 |
| 4,677,474 | 6/1987 | Sato et al. | 348/87 |
| 4,870,288 | 9/1989 | Abuku et al. | 250/548 |
| 5,168,306 | 12/1992 | Morimoto et al. | 355/53 |
| 5,270,771 | 12/1993 | Sato | 355/53 |
| 5,499,099 | 3/1996 | Sato et al. | 356/400 |
| 5,502,313 | 3/1996 | Nakamura et al. | 250/548 |
| 5,569,930 | 10/1996 | Imai | 250/548 |

FOREIGN PATENT DOCUMENTS 0613051   8/1994   European Pat. Off. .

2-58766   12/1990   Japan .

*Primary Examiner*—Que Le
*Attorney, Agent, or Firm*—Fitzpatrick, Cella, Harper & Scinto

[57] ABSTRACT

A scan type exposure apparatus includes a first movable stage for carrying a reticle thereon and a second movable stage for carrying a wafer thereon, a projection system for projecting a pattern of the reticle onto the wafer through a projection optical system while scanningly moving the first and second movable stages in a timed relation, relative to the projection optical system, a first mark formed on the reticle and including a plurality of marks arrayed along a scan direction, a reference plate fixedly mounted on the second movable stage and having a second mark including a plurality of marks arrayed along the scan direction, a third movable stage for carrying the second movable stage thereon and being movable in a direction different from the movement direction of the second stage, and a photodetector fixedly mounted on the third movable stage. The second and third movable stages are moved so as to place the reference plate and the photodetector at a position of an image of the first mark as projected by the projection optical system, and the image of the first mark is detected through the second mark by using the photodetector while moving the first and second movable stages in a timed relation, relative to the projection optical system.

11 Claims, 10 Drawing Sheets

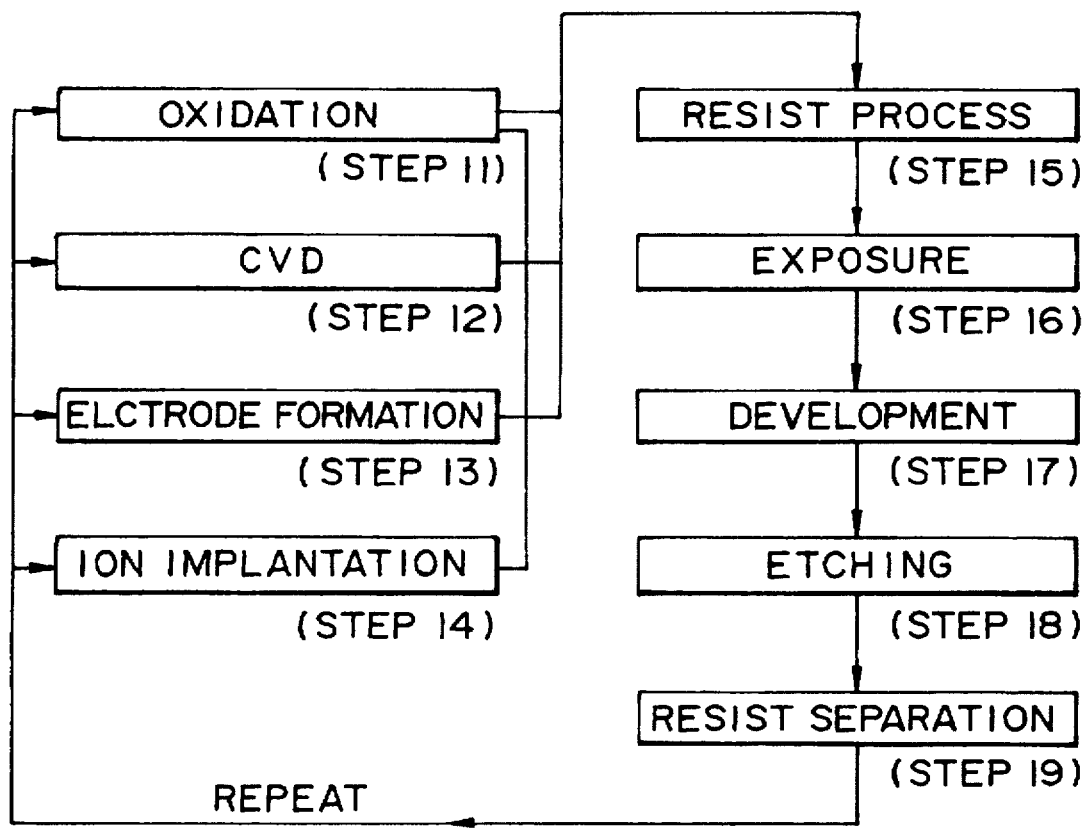
F I G. 14

1

SCAN TYPE EXPOSURE APPARATUS AND METHOD HAVING A REFERENCE PLATE WITH MARKS FOR IMAGE DETECTION

FIELD OF THE INVENTION AND RELATED ART

This invention relates to a scan type exposure apparatus and an exposure method using the same, wherein a pattern of a reticle is transferred to a wafer while the reticle and the wafer are scanningly moved in a timed relation, and relative to a projection optical system.

FIG. 12 shows an example of relative positional relationship between a wafer and a reticle in a step-and-repeat type exposure apparatus, as well as the manner of detecting an image plane of a projection optical system thereof.

In FIG. 12, denoted at 200 is an Hg lamp which is a light source of an illumination system. Denoted at 201 is an elliptical mirror for collecting light from the Hg lamp 200, and denoted at 202 is a condenser lens for collecting, to a reticle 6, the light from the elliptical mirror 201. The reticle 6 is formed with a transmission mark for alignment operation.

Denoted at 13 is a projection optical system, and denoted at 14 is a wafer. Denoted at 15 is a wafer chuck, and denoted at 203 is a transmission mark of the wafer which corresponds to the transmission mark of the reticle 6. Denoted at 204 is a light quantity sensor for detecting the quantity of light passed through the transmission mark 203 of the wafer. The light quantity sensor 204 is made integral with the wafer transmission mark 203. Denoted at 205 is an X—Y—Z stage for moving the wafer in X, Y and Z directions, and denoted at 206 is a position detecting system for detecting the position of the X—Y—Z stage 205. Denoted at 207 is a light quantity measuring system for the light quantity sensor, and denoted at 208 is a control system.

In this type of exposure apparatus, the transmission mark 203 and the light quantity sensor 204 provided on the X—Y—Z stage 205 are made as a unit with each other, and, by detecting the position of the largest light quantity while moving them in the X, Y and Z directions, the position of a projected image of the reticle as well as the position of the image plane thereof are determined (Japanese Published Patent Application, Publication No. 58766/1990).

The above-mentioned method in the step-and-repeat type exposure apparatus is effective in a case where the reticle is held stationary relative to the projection optical system.

However, in scan type exposure apparatuses which have recently attracted much attention, there are problems such as follows.

(1) Speckle:

In the scan type exposure apparatuses, in many cases a deep ultraviolet laser (e.g., KrF excimer laser or ArF excimer laser) is used as a light source of high power and short wave length, for improvements in resolving power and productivity.

Such deep ultraviolet laser generally has a high coherency, and there occurs an interference pattern (speckle) upon the surface of a wafer.

In the scan type exposure apparatuses, during actual exposure process, a reticle and a wafer are scanningly moved relative to illumination light (or to the projection system). Thus, the effect of such speckle is reduced considerably. If the method or arrangement for detecting the position of a reticle projected image or the position of the image plane while holding the reticle stationary, is applied to such scan type exposure apparatus, since the detection is to be done in a substantially stationary state (that is, without using advantageous features of the scan type exposure apparatus), the detection is largely affected by the speckle. As a result, accurate light quantity measurement is not attainable.

(2) Effective Light Source Difference:

In scan type exposure apparatuses, as compared with step-and-repeat type exposure apparatuses, the light energy density in the exposure light irradiation area should be made higher so as to retain the throughput. To this end, particular attention should be paid in designing in respect to the durability of optical components. As one measure for this, as regards the scan direction, it may be good to provide an effective light source during the scan motion (the shape of effective light source is different in the exposure region in the scan direction of the projection optical system).. This enables separation, within the projection optical system, of the light energy collected position between the scan direction and a direction perpendicular to the scan direction, and it prevents concentration of light energy to an element or elements constituting the projection optical system.

However, if the aforementioned measure is taken, the effective light source is different between the scan state and the stationary state.

In other words, in the method or arrangement for detecting the position of the reticle projected image or detecting the image plane in substantially stationary state, because of the difference in effective light source in the exposure region, it is difficult to detect the position of the reticle projected image or the image plane as in the scan state, accurately.

(3) Scan Stage Attitude:

In scan type exposure apparatuses, the attitude of the reticle stage for scanningly moving a reticle and the attitude of the scan stage for scanningly moving a wafer are so controlled to keep an idealistic position during the scanning movement. However, there is not provided a specific means for detecting how the attitude changes between the scan state and the stationary state. Namely, in the method which performs measurement in substantially stationary state, the effect of the attitude of the scan stage is not included and, therefore, it is difficult to detect the position of the reticle projected image and the image plane in the scan state, accurately.

SUMMARY OF THE INVENTION

It is an object of the present invention to provide a method and/or apparatus for a scan type exposure apparatus, by which the position of a reticle projected image, the image plane position and/or a magnification error in the scan state can be measured accurately.

In accordance with an aspect of the present invention, there is provided a scan type exposure apparatus, comprising: a first movable stage for carrying a first object thereon and being movable in a predetermined one-dimensional direction; a second movable stage for carrying a second object thereon and being movable in a predetermined one-dimensional direction; a projection system for projecting a pattern of the first object onto the second object through a projection optical system while scanningly moving said first and second movable stages in a timed relation, relative to said projection optical system; a first mark formed on the first object and including a plurality of marks arrayed along a scan direction; a reference plate fixedly mounted on said second movable stage and having a second mark including a plurality of marks arrayed along the scan direction; a third movable stage for carrying said second movable stage thereon and being movable in a direction different from the movement direction of said second stage; a photodetector fixedly mounted on said third movable stage; and control means having a first function for moving said second and third movable stages so as to place said reference plate and said photodetector at a position of an image of the first mark as projected by said projection optical system and a second function for detecting the image of the first mark through the second mark by using said photodetector while moving said first and second movable stages in a timed relation, relative to said projection optical system.

In one preferred form according to this aspect of the present invention, said second movable stage includes displaceable means being displaceable in a direction of an optical axis of said projection optical system, and said control means is operable to actuate said displaceable means to change the position of said reference plate with respect to the optical axis direction so that said photodetector detects the image of the first mark through the second mark.

In another preferred form of this aspect of the present invention, each of the first and second marks comprises a mark including a plurality of marks arrayed periodically.

In a further preferred form of this aspect of the present invention, each of the first and second marks comprises a mark including a plurality of marks having different inclinations.

In a yet further preferred form of this aspect of the present invention, said control means determines the position where the first mark is to be projected upon the second mark through said projection optical system, on the basis of a signal responsive to the detection, by said photodetector, of the image of the first mark through the second mark and on the basis of the positions of said first and second movable stages at the time as said signal is detected.

In a yet further preferred form of this aspect of the present invention, said control means determines the position in the optical axis direction of said projection optical system where the first mark is to be imaged through said projection optical system, on the basis of a signal responsive to the detection, by said photodetector, of the image of the first mark through the second mark and on the basis of the position of the second movable stage as said signal is detected.

In accordance with another aspect of the present invention, there is provided an exposure method usable with a scan type exposure apparatus for projecting a pattern of a first object onto a second object through a projection optical system while scanningly moving the first and second objects in a timed relation, relative to the projection optical system, said method comprising the steps of: providing, on the first object, a first mark including a plurality of marks arrayed along a scan direction; providing a reference plate fixedly mounted on a movable stage for carrying the second object thereon, and having a second mark including a plurality of marks arrayed along the scan direction; placing a photodetector at a position where an image of the first mark is projected or to be projected by the projection optical system; and detecting the image of the first mark through the second mark by using the photodetector while scanningly moving the first object and the reference plate in a timed relation, relative to the projection optical system.

In one preferred form according to this aspect of the present invention, in said detecting step, the image of the first mark is detected through the second mark by using the photodetector while changing the position of the reference plate with respect to the optical axis direction of the projection optical system.

In another preferred form of this aspect of the present invention, the method further comprises determining the position where the first mark is projected or to be projected upon the second mark by the projection optical system, on the basis of the positions of the first and second marks at a time as the image of the first mark is detected through the second mark by using the photodetector.

In a further preferred form of this aspect of the present invention, the method further comprises determining the position, with respect to the optical axis direction, where the first mark is imaged by through the projection optical system, on the basis of a signal responsive to the detection of the image of the first mark through the second mark by using the photodetector and on the basis of the position of the reference place with respect to the optical axis direction at a time as the signal is detected.

In accordance with a further aspect of the present invention, there is provided a device manufacturing method usable with a scan type exposure apparatus for projecting a pattern of a reticle onto a wafer through a projection optical system while scanningly moving the reticle and the wafer in a timed relation, relative to the projection optical system, said method comprising the steps of: providing, on the reticle, a reticle mark including a plurality of marks arrayed along a scan direction; providing a reference plate fixedly mounted on a movable stage for carrying the wafer thereon, and having a wafer mark including a plurality of marks arrayed along the scan direction; placing a photodetector at a position where an image of the reticle mark is projected or to be projected by the projection optical system; and detecting the image of the reticle mark through the wafer mark by using the photodetector while scanningly moving the reticle and the reference plate in a timed relation, relative to the projection optical system.

These and other objects, features and advantages of the present invention will become more apparent upon a consideration of the following description of the preferred embodiments of the present invention taken in conjunction with the accompanying drawings.

Figure 9:
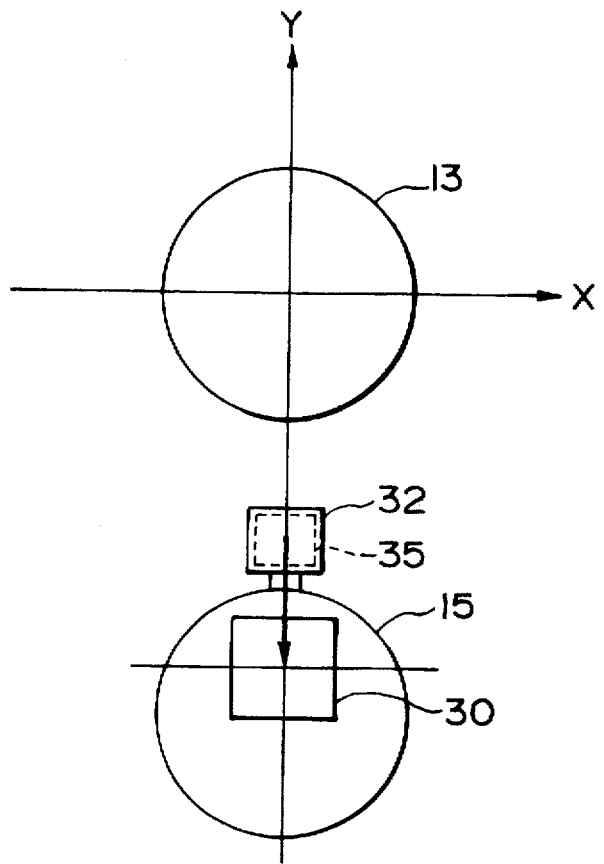

FIG. 9 is a top plan view of a scan type exposure apparatus according to an embodiment of the present invention, for explaining the positional relationship.

Figure 10:
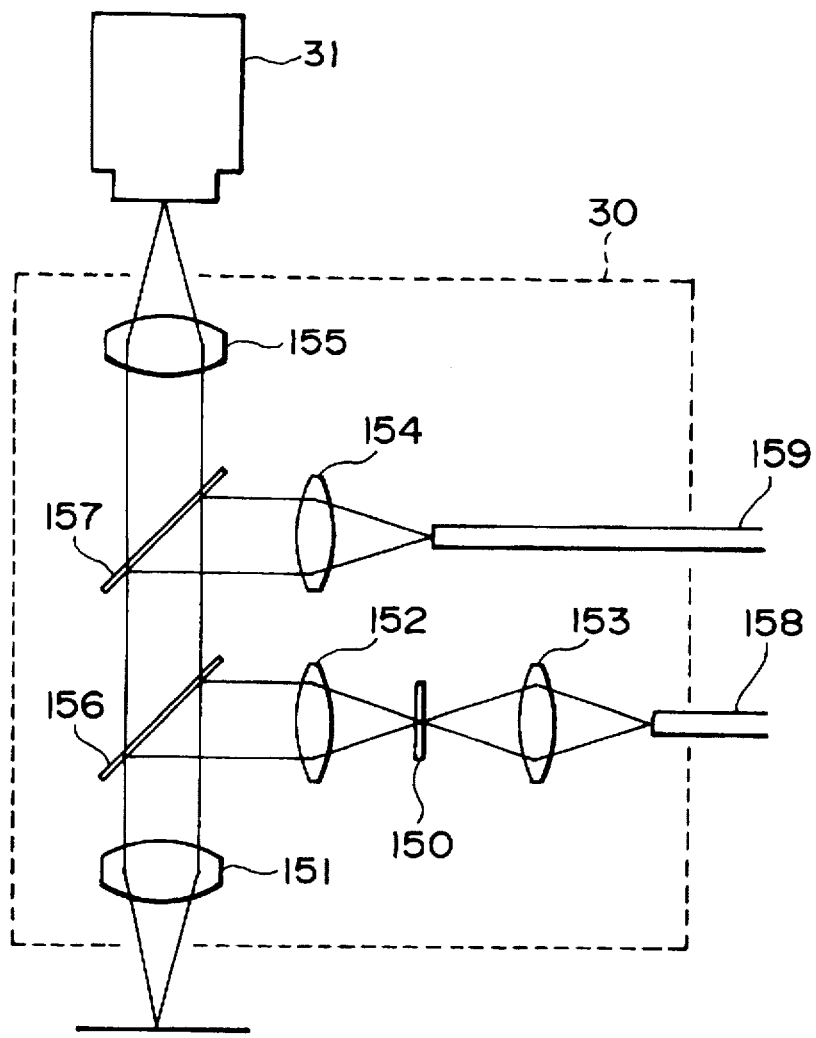

FIG. 10 is a schematic view of an alignment microscope.

Figure 11:
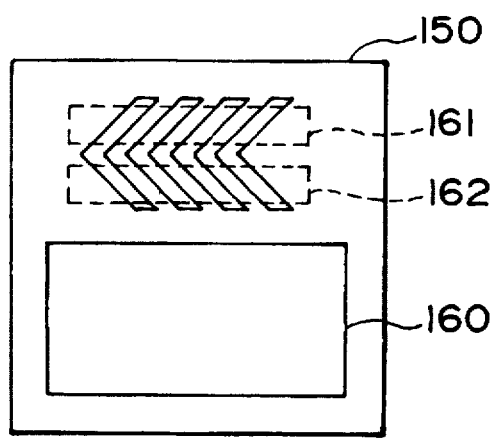

FIG. 11 is a schematic view of a reference pattern within the alignment microscope.

Figure 12:
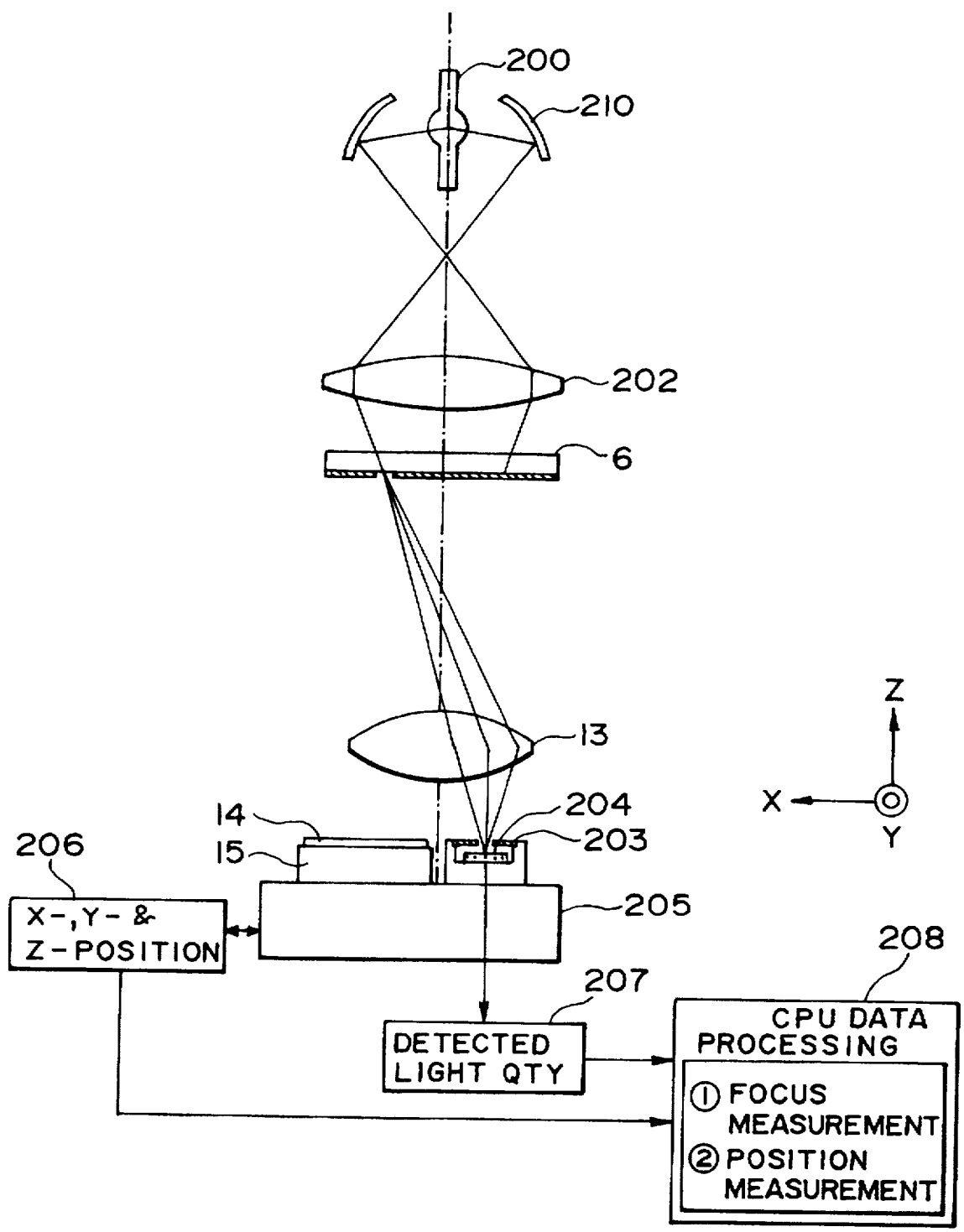

FIG. 12 is a schematic view of a scan type exposure apparatus according to an embodiment of the present invention, for explaining the positional relationship.

Figure 13:
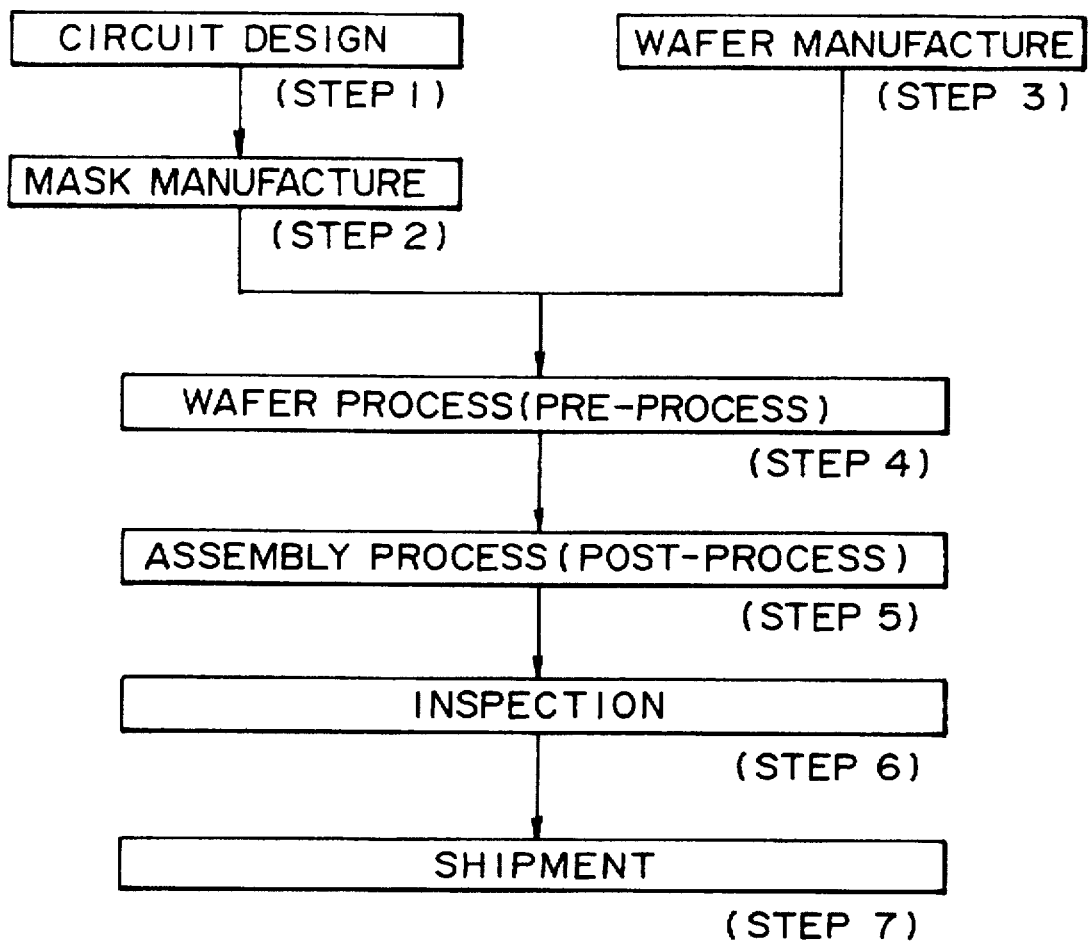

FIG. 13 is a flow chart of device manufacturing processes.

FIG. 14 is a flow chart of a wafer process.

DESCRIPTION OF THE PREFERRED EMBODIMENTS

Figure 1:
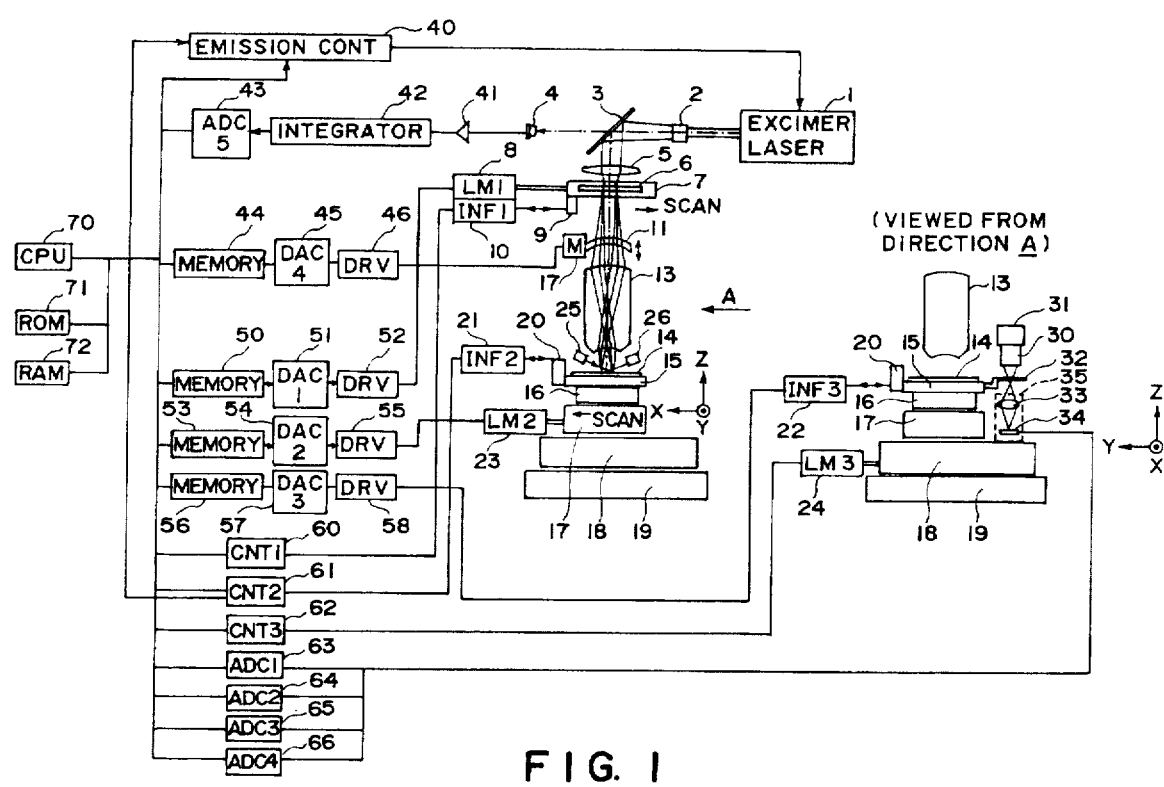
FIG. 1 is a schematic and diagrammatic view, showing general arrangement of a scan type exposure apparatus according to one embodiment of the present invention.

Referring to FIG. 1 showing a scan type exposure apparatus according to an embodiment of the present invention, denoted at 1 is an excimer laser for producing pulse light, and denoted at 2 is a light beam shaping means for shaping the light from the excimer laser into a desired size. Denoted at 3 is a mirror, and denoted at 4 is a photosensor for detecting the illuminance upon the surface of a reticle. Denoted at 5 is a condenser lens, and denoted at 6 is a reticle. Denoted at 7 is a reticle stage for holding the reticle 6 and performing scan motion during the exposure process. Denoted at 8 is a linear motor for scanningly moving the reticle stage 7 in a direction as illustrated, and denoted at 9 is a bar mirror fixedly mounted on the reticle stage 7. Denoted at 10 is a laser interferometer for detecting the speed or position of the reticle stage 7, and denoted at 11 is a magnification adjusting mechanism for minutely changing the magnification of a projection system. Denoted at 12 is a motor for actuating the magnification adjusting mechanism 11, and denoted at 13 is a projection optical system for projecting a pattern of the reticle onto a wafer 14.

Denoted at 15 is a wafer chuck for holding a wafer 14, and denoted at 16 is a θZ tilt stage for moving the wafer chuck 15 rotationally, vertically and inclinedly. Denoted at 17 is a scan stage for holding the θZ stage 16 and performing the scan motion during the exposure operation. Denoted at 18 is a Y stage for moving the scan stage 17 in a direction perpendicular to the scan direction, and denoted at 19 is a stage base on which the Y stage 18 is mounted. Denoted at 20 is an L-shaped bar mirror fixedly mounted on the wafer chuck 15, and denoted at 21 is a laser interferometer for detecting the speed or position of the wafer chuck 15 in the scan direction. Denoted at 22 is a laser interferometer for detecting the speed or position of the wafer chuck 15 in a direction perpendicular to the scan direction. Denoted at 23 is a linear motor for driving the scan stage 17 in the scan direction, and denoted at 24 is a linear motor for driving the Y stage 18 in a direction perpendicular to the scan direction.

Denoted at 25 is a light emitting portion of a tilt and focus detection system, for projecting a light beam onto the surface of the wafer. Denoted at 26 is a light receiving portion of the tilt and focus detection system, for measuring the position of light from the light emitting portion 25 as reflected by the surface of the wafer 14, to thereby measure the tilt and position of the wafer surface. The components denoted at 25 and 26 cooperate to provide the tilt and focus detection system.

Denoted at 30 is an alignment microscope for measuring the position of an alignment mark on the wafer 14, and denoted at 31 is a TV camera mounted on the alignment microscope 30. Denoted at 32 is a scan stage side transmission mark plate fixedly mounted on the wafer chuck 15, on which a reticle side transmission mark is to be imaged. Denoted at 33 is an imaging lens for projecting light from an image of the reticle side transmission mark onto a light quantity sensor 34. Denoted at 34 is the light quantity sensor which comprises four light detecting portions. Denoted at 35 is a light quantity sensor unit which is fixedly mounted on the Y stage and which comprises the imaging lens 33 and the light quantity sensor 34 being made as a unit.

Denoted at 40 is a light emission controller which is operable in response to input of positional information of the scan stage 17 to produce and apply a light emission command signal to the excimer laser 1 when the scan stage 17 is brought into a predetermined positional relationship. Denoted at 41 is a current-to-voltage converter for converting a photoelectric current signal from the photosensor 4, detecting the illuminance on the reticle surface, into a voltage signal. Denoted at 42 is an integrator for integrating voltage output signals of the current-to-voltage converter 41, and denoted at 43 is an analog-to-digital (A/D) converter for converting analog data of the integrator 42 into digital data. Denoted at 44 is a memory for setting the position of a relay lens in response to a central processing unit (CPU) 70. Denoted at 45 is a digital-to-analog (D/A) converter for converting digital data, from the memory 44, into analog data. Denoted at 46 is a driver for actuating a relay lens driving motor 12 in accordance with the positional data from the D/A converter 45.

Denoted at 50, 53 and 56 are memories for retaining scan speed command signals for the reticle stage 7, the scan stage 17 and the Y stage 18, respectively. Denoted at 51, 54 and 57 are A/D converters for converting digital data, from the memories 50, 53 and 56, into analog data, and denoted at 52, 55 and 58 are drivers for amplifying analog signals from the A/D converters 51, 54 and 57, for actuation of the linear motors 8, 23 and 24. Denoted at 60, 61 and 62 are position counters for the reticle stage 7, the scan stage 17 and the Y stage 18, respectively. Denoted at 63, 64, 65 and 66 are A/D converters for converting analog signals, applied thereto from the light quantity sensor, having four light detecting portions, into digital data. Denoted at 70 is the central processing unit (CPU) which operates to control the exposure apparatus as a whole. Denoted at 71 is a read-only-memory (ROM) which stores therein various programs and control data for the CPU 70. Denoted at 72 is a random-access-memory (RAM) which is to be used by the CPU for temporary storage.

The operation of this embodiment will be explained with respect to the items listed below:

(1) Reticle Setting
(2) Reticle Position Detection
(3) Reticle Image Plane Detection
(4) Whole Reticle Surface Magnification Error Detection
(5) Alignment Microscope Rough Focus Adjustment
(6) Alignment Microscope Reference Pattern Position Detection
(7) Wafer Loading
(8) Wafer Position Detection
(9) Scan Exposure
(10) Wafer Unloading (1) Reticle Setting:

After the reticle 6 is loaded on the reticle stage 7, a microscope (not shown) for the reticle and a reticle driving mechanism (not shown) are used to place the reticle 6 at a predetermined position on the reticle stage 7.

Figure 2:
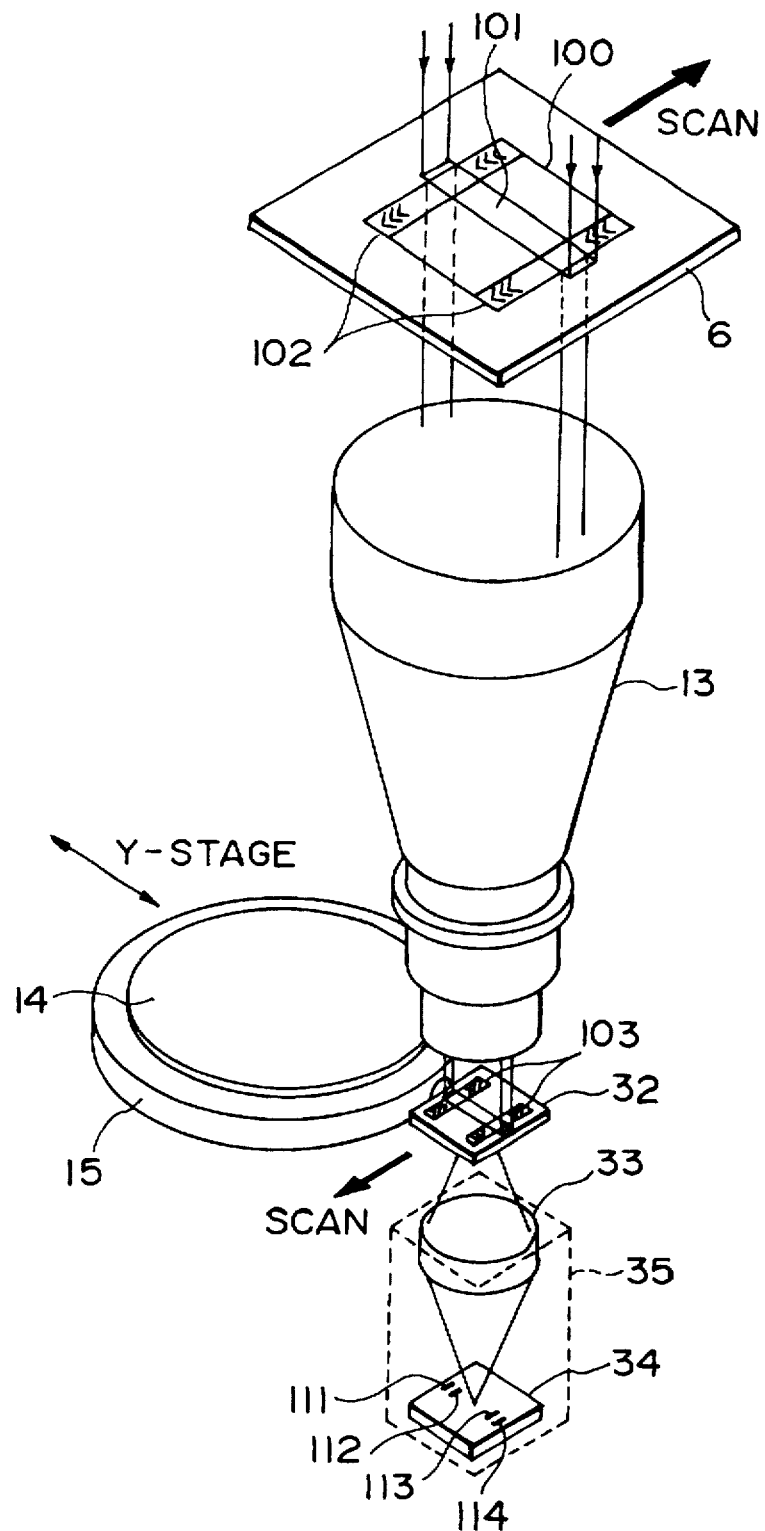
FIG. 2 is a schematic and perspective view of a main portion of a scan type exposure apparatus according to an embodiment of the present invention.

(2) Reticle Position Detection:

After the positioning of the reticle 6 is completed, the light quantity sensor unit 35 provided on the Y stage 18 is moved, with the movement of the Y stage 18, to the exposure area of the projection optical system 13. Also, with the movement of the scan stage 17, the scan stage side transmission mark plate 32 is moved to the exposure area. With this motion of the scan stage 17, the scan stage side transmission mark plate 32 moves to a position above the light quantity sensor unit 35. This is illustrated in FIG. 2. In FIG. 2, denoted at 100 is the zone of the reticle which is going to be subjected to the exposure process. Denoted at 101 is an illumination region defined by the illumination system. Denoted at 102 are reticle side transmission marks which are formed on the reticle 6, and denoted at 103 are transmission marks which are formed on the scan stage side transmission mark plate. Denoted at 111–114 are four light quantity detecting portions of the light quantity sensor 34.

Figure 3:
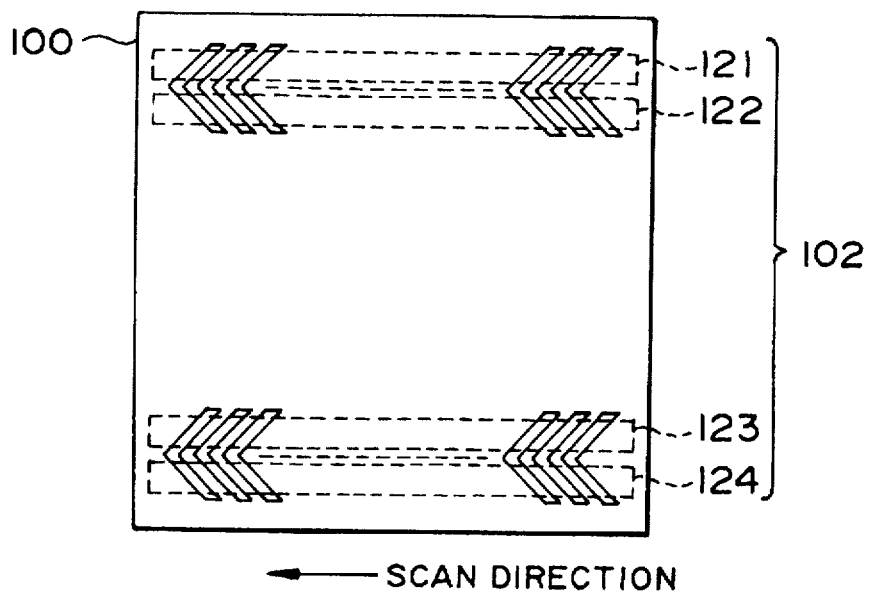
FIG. 3 is an enlarged view of a transmission mark of a reticle.
Figure 4:
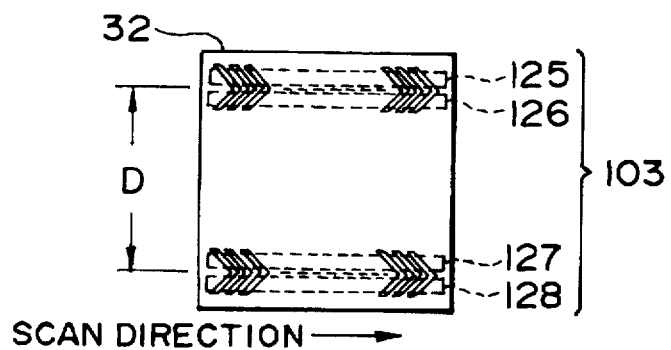
FIG. 4 is an enlarged view of a transmission mark of a wafer.

After the operation described above, the reticle stage 7 and the scan stage 17 are positioned so as to assure that an image of a particular mark, at a central portion in the scan direction, of the reticle side transmission marks 121–124 (FIG. 3) as formed through the projection optical system 13 is registered with a particular mark, at a central portion in the scan direction, of the scan stage side transmission marks 125–128 (FIG. 4).

Subsequently, scanning motion at a scan speed similar to that during the wafer exposure process starts.

Figure 5:
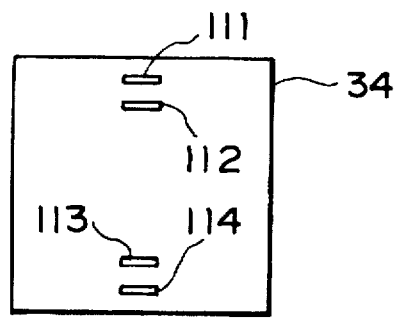
FIG. 5 is an enlarged view of a light quantity sensor.

Here, it is to be noted that, if the reticle stage 7 and the scan stage 17 are driven with their relative positions being completely aligned with each other, there does not occur relative positional deviation between the reticle side transmission mark 102 and the scan stage side transmission mark 103 during the scan motion, such that the light quantity that enters the light quantity detecting portions 111–114 (FIG. 5) does not change. In consideration of this, in this embodiment, except for the particular marks at the central portions, the relative position of the reticle side transmission marks 102 and the scan stage side transmission marks 103 is specifically set to be deviated from the idealistic relative position. This is illustrated in part 8-1 of FIG. 8.

Figure 8:
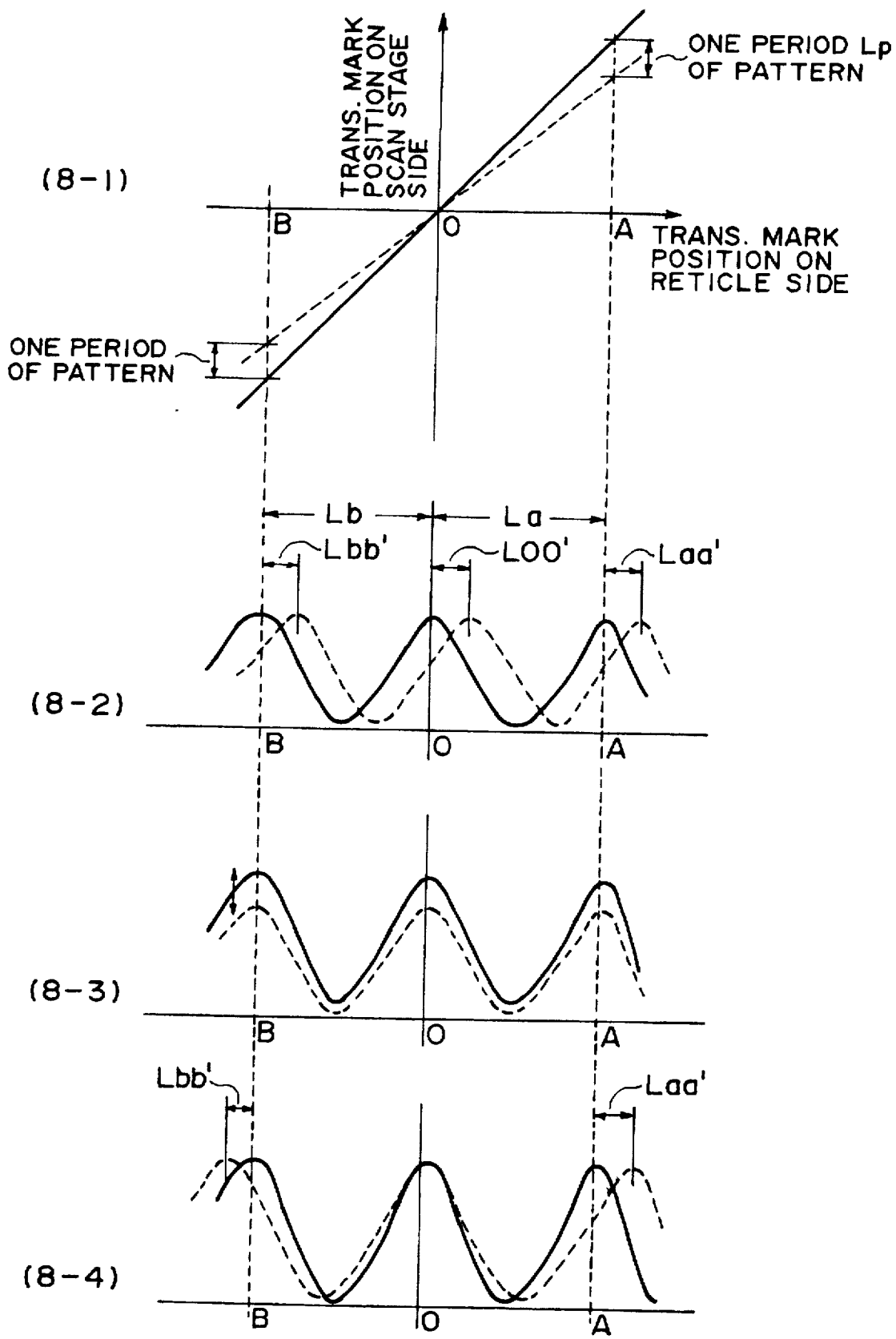
FIG. 8 is a schematic view for explaining the process of detections wherein part 8-1 of FIG. 8 schematically illustrates the relative positional relationship between a transmission mark of a reticle and a transmission mark of a wafer, wherein part 8-2 of FIG. 8 schematically illustrates output signals of the light quantity sensor during the reticle position measurement, wherein part 8-3 of FIG. 8 schematically illustrates output signals of the light quantity sensor during the reticle image plane measurement, and wherein part 8-4 of FIG. 8 schematically illustrates output signals of the light quantity sensor during the reticle magnification error measurement.

In part 8-1 of FIG. 8, the solid line depicts the idealistic relative position, and the broken line depicts the actual relative position in the measurement.

In part 8-1 of FIG. 8, the origin O is the position of the reticle stage 7 and the scan stage 17 where particular marks at central portions of the reticle side transmission marks 102 and of the scan stage side transmission marks should be registered with each other. Particular points A and B are those positions where the periodicity of the reticle side transmission marks 102 and that of the scan stage side transmission marks 103 are shifted just by one period (Lp).

Therefore, if at the origin O the particular marks at the central portions of the reticle side transmission marks 102 and of the scan stage side transmission marks 103 are completely registered with each other and if at the particular points A and B the periodicity of the reticle side transmission marks 102 and that of the scan stage side transmission marks 103 are completely shifted by one period (Lp), then, as shown by a solid line in part 8-2 of FIG. 8, the outputs of the light quantity detecting portions 111–114 all become maximum at the origin O and at the particular points A and B.

Here, if at the origin O the particular marks at the central portions of the reticle side transmission marks 102 and of the scan stage side transmission marks 103 are not completely registered with each other, then, as shown by a broken line in part 8-2 of FIG. 8, the peak point of any of the outputs of the light quantity detecting portions 111–114 or the peak points of all the outputs of them become deviated from the origin O.

Figure 6:
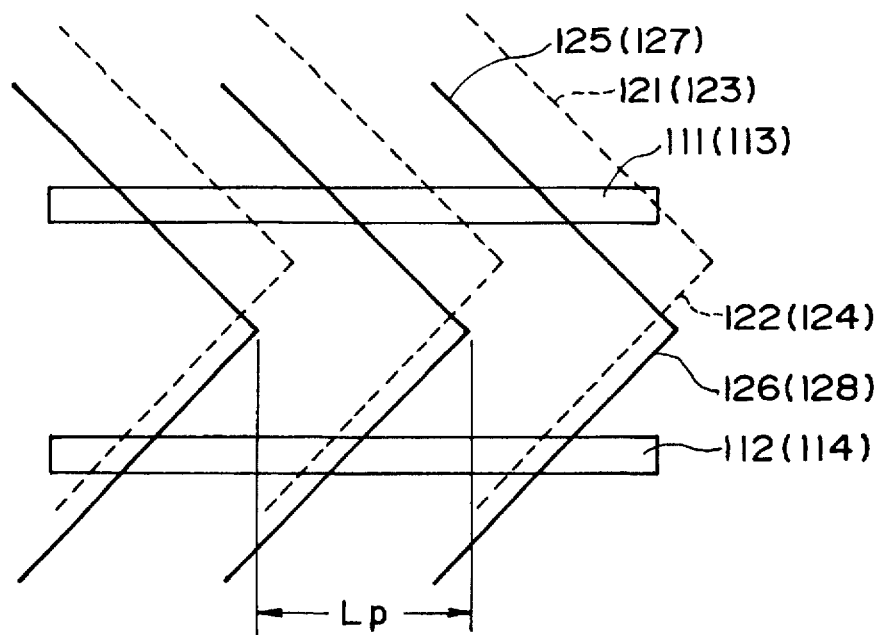
FIG. 6 is a schematic view for explaining the manner how the position of a reticle is detected.

In FIG. 6, broken lines correspond to central lines of the reticle side transmission marks 121 and 122, and solid lines correspond to central lines of the scan stage side transmission marks 125 and 126.

Figure 7:
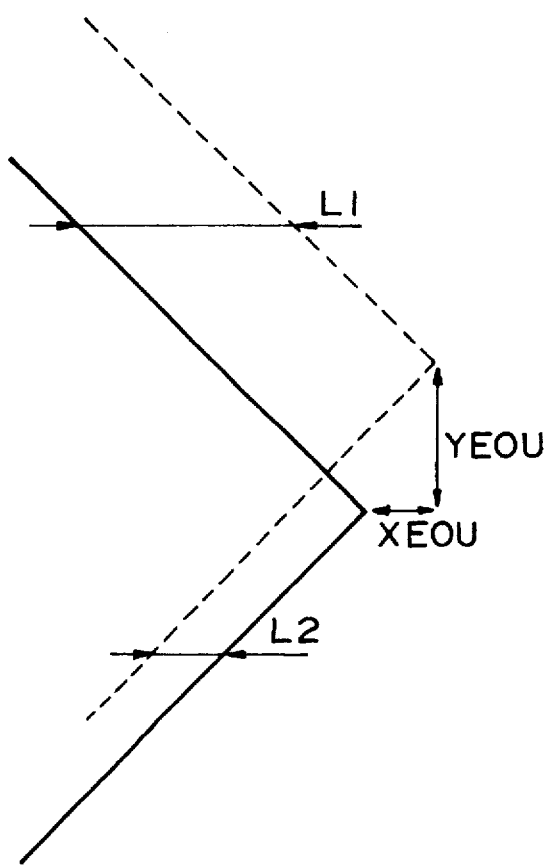
FIG. 7 is a schematic view, similar to FIG. 6, for explaining the manner how the position of a reticle is detected.

FIG. 7 is an enlarged view of a portion of FIG. 6, and it illustrates a case where the reticle side transmission mark is deviated from the idealistic relative position to the scan stage side transmission mark, by an amount "$X_{eou}, Y_{eou}$". In this occasion, the relative position with which the outputs of the upper light quantity sensors 111 and 112 become highest is deviated from the idealistic relative position by $L_1$ and $L_2$, respectively.

In this embodiment, every transmission mark has an inclination of 45 deg. with respect to the scan direction. It follows therefore that:

$$X_{eou}+Y_{eou}=L_1 \qquad (1)$$

$$X_{eou}-Y_{eou}=L_2 \qquad (2)$$

From this, it follows that:

$$X_{eou}=\tfrac{1}{2}\times(L_1+L_2) \qquad (3)$$

$$Y_{eou}=\tfrac{1}{2}\times(L_1-L_2) \qquad (4)$$

Simultaneously with the above, measurement is performed in respect to another pair of reticle side transmission marks 123 and 124 and to another pair of scan stage side transmission marks 127 and 128. If the reticle side transmission marks are deviated from the idealistic relative position to the scan stage side transmission marks by $L_3$ and $L_4$, respectively, the following relations are given:

$$X_{eod}=\tfrac{1}{2}\times(L_3+L_4) \qquad (5)$$

$$Y_{eod}=\tfrac{1}{2}\times(L_3-L_4) \qquad (6)$$

Here, if the spacing in the Y direction between the upper transmission mark 125 (126) and the lower transmission mark 127 (128) is denoted by D, the deviation from the idealistic position of the reticle image is denoted by ($X_{eo}$, $Y_{eo}$), the angular deviation is denoted by $\theta_{eo}$, and the center magnification error is denoted by $M_{eo}$, then, from the equations of $X_{eou}$, $Y_{eou}$, $X_{eod}$ and $Y_{eod}$, it follows that:

$$X_{eo}=\tfrac{1}{2}\times(X_{eou}+X_{eod}) \qquad (7)$$

$$Y_{eo}=\tfrac{1}{2}\times(Y_{eou}+Y_{eod}) \qquad (8)$$

$$\theta_{eo}=\arctan\{(X_{eou}-X_{eod})/D\} \qquad (9)$$

$$M_{eo}=(Y_{eou}-Y_{eod})/D \qquad (10)$$

By the measurements and calculations described above, deviation ($X_{eo}, Y_{eo}$) from the idealistic position of the reticle image as well as the angular deviation $\theta_{eo}$ and the center magnification error $M_{eo}$ are specified.

It is to be noted that $L_1$–$L_4$ are determined easily from the relative position with which the light quantity detecting portions 111–114 provides maximum levels.

Now, the manner of determining $L_1$ will be explained with reference to part 8-1 and part 8-2 of FIG. 8.

In part 8-2 of FIG. 8, $L_{oo}'$ shows the distance to the point where the light detecting portion 111 shows a maximum. If the distance on the reticle side with which the one period of pattern is shifted is denoted by La and the spacing of the one period of pattern is demoted by Lp, then:

$$L_1 = Lp \times (L_{\infty}'/La) \tag{11}$$

With the manner similar to that described above, $L_{2-LA}$ can be determined easily by measurements and calculations.

In this embodiment, except for the particular marks at the central portions, the relative position of the reticle side transmission marks 102 and the scan stage side transmission marks 103 is specifically set to be deviated from the idealistic relative position, as described. Here, the distances from the origin O to the particular points A and B are La and Lb, respectively, each being of an order of 10 mm. As compared therewith, one period of the scan stage transmission mark is of an order of a few microns. Therefore, between the reticle position detecting operation and the actual exposure operation, the speckle, the effective light source and the attitude all can be well considered unchanged.

(3) Reticle Image Plane Position Detection:

After measurements of deviations $X_{eo}, Y_{eo}$ from the idealistic position of the reticle image as well as angular deviation $\theta_{eo}$ and magnification error $M_{eo}$ described above, corrections are performed. As regards the deviation $X_{eo}, Y_{eo}$ from the idealistic relative position, it is corrected by changing the relative position on the scan stage 17 side. The angular deviation $\theta_{eo}$ is corrected by performing $\theta$ rotation of the reticle on the reticle stage 7 side. The center magnification error $M_{eo}$ is corrected by using the magnification adjusting mechanism 11.

After this, scan motion is performed plural times while taking correspondence between the reticle stage side transmission marks 102 and the scan stage side transmission marks 103, and outputs of the light quantity detecting portions 111–114 are detected. Here, for every scan motion, the position of the scan stage side transmission marks 103 is changed by means of the $\theta Z$ stage 16 in the focus direction of the projection system 13.

As the position of the scan stage side transmission marks 103 is changed in the focus direction of the projection system 13, the outputs of the light quantity detecting portions 111–114 change such as shown in part 8-3 of FIG. 8.

Here, the position of the scan stage side transmission mark in the Z direction where the outputs of the light quantity detecting portions 111–114 become maximum, corresponds to the image plane position of the reticle.

From the position in the Z direction where the outputs of the light quantity detecting portions 111 and 112 become maximum and from the position in the Z direction where the outputs of the light detecting portions 113 and 114 become maximum, the position and inclination of the image plane of the reticle 6 with respect to the scan position, namely, the idealistic image plane, can be determined.

This idealistic image plane should be reproduced, during the subsequent wafer exposure process, in a timed relation with the scan motion and relative to the wafer surface. To this end, after the measurements, the scan stage side transmission mark plate 32 is moved to below the projection system 13, and in a timed relation with the scan motion, the idealistic image plane is reproduced by using the scan stage side transmission mark plate 13. The idealistic image plane position as determined in this operation on the basis of the tilt and focus detection system 25 is stored into a memory.

(4) Whole Reticle Surface Magnification Error Detection:

After measurements and corrections of deviations $X_{eo}$, $Y_{eo}$ from the idealistic position of the reticle 6 as well as angular deviation $\theta_{eo}$ and magnification error $M_{eo}$ and after measurement of the idealistic image plane of the reticle with respect to the scan position, the scan motion is performed while taking correspondence again between the reticle stage side transmission marks 102 and the scan stage side transmission marks 103 so as to correct all the errors, and the outputs of the light quantity detecting portions 111–114 are measured.

Here, whether the correction is completed with respect to the position of the particular mark in the central portion of the transmission marks is checked. Simultaneously, whether at the particular points A and B the outputs of the light quantity detecting portions 111–114 become maximum is checked.

If, as regards the particular points A and B, any one of the outputs of the light quantity detecting portions 111–114 becomes maximum at a point other than the particular points A and B, in a similar manner as the case of the reticle position detection (Item (2)), the following procedure is taken: That is, deviation $(X_{ea}, Y_{ea})$ from the idealistic position of the reticle image at the position A as well as angular deviation $\theta_{ea}$ and magnification error $M_{ea}$ and also deviation $(X_{eb}, Y_{eb})$ from the idealistic position of the reticle at the position B as well as angular deviation $\theta_{eb}$ and magnification error are detected. From the results and on the basis of $X_{eo}$, $Y_{eo}, \theta_{eo}$ and $M_{eo}$ at the origin O, while using the positional deviations, the angular deviations and the magnification errors in the spacing from the origin O to the position A and in the spacing from the origin O to the position B as an approximation function of the position "r" of the reticle side transmission marks in the scan direction, the values of $X_{e(r)}$, $Y_{e(r)}, \theta_{e(r)}$ and $M_{e(r)}$ are determined. As regards $X_{e(r)}$, it is corrected by changing the relative position of the transmission marks in a timed relation with the scan motion. As regards $Y_{e(r)}$, it is corrected by changing the position of the Y stage in a timed relation with the scan motion. As regards $\theta_{e(r)}$, it is corrected by performing rotation on the wafer side in a timed relation with the scan motion. As regards $M_{e(r)}$, it is corrected by using the magnification adjusting mechanism 11 in a timed relation with the scan motion. All deviations can be corrected in this manner.

On the basis of the correction values $X_{e(r)}, Y_{e(r)}, \theta_{e(r)}$ and $M_{e(r)}$, how each of the relative position of the scan stage, the position of the Y stage, rotation on the wafer side, the magnification adjusting mechanism and the image plane position should be corrected or actuated, is determined.

The data to be used in such correction and actuation is correction data to the reticle as viewed from the scan stage side transmission marks. Thus, hereinafter it will be referred to also as "correction data to the reticle". As a matter of course, this correction data to the reticle is the function of the scan direction position of the reticle.

(5) Alignment Microscope Rough Focus Adjustment:

While taking the scan stage side transmission mark 103 as the origin focus position as determined above, it is placed below the alignment microscope.

Here, an objective lens of the alignment microscope is displaced along the optical axis direction so that the transmission mark is imaged upon the TV camera 31. This is to reduce, as much as possible, the motion in the focus direction after the wafer having been aligned is moved and placed below the projection optical system.

(6) Alignment Microscope Reference Pattern Position Detection:

In the exposure apparatus of this embodiment, the projection system 13, the alignment microscope 30 and the light quantity sensor unit 35 are disposed along the same Y axis as shown in FIG. 9. Thus, with the motion of the Y stage 18, the light quantity sensor unit 35 can be positioned below the alignment microscope 30 and, with the motion of the scan stage 17, the scan stage side transmission mark plate 32 can be positioned above the light quantity sensor unit 35.

The alignment microscope 30 has such a structure as shown in FIG. 10, wherein denoted at 150 is a reference pattern defined within the alignment microscope 30. Denoted at 151 is an objective lens, and denoted at 152–155 are optical lenses. Denoted at 156 and 157 are half mirrors, and denoted at 158 and 159 are optical fibers for directing light for illumination, from a light source (not shown). Additionally, as shown in FIG. 11, reticle-associated marks 161 and 162 which provide a positional reference of the alignment microscope, are disposed within the reference mark 150.

The positioning of the scan stage side transmission mark plate 32 in the scan direction is performed so as to assure that projected images of the reticle-associated marks 161 and 162 are registered with particular marks of the transmission marks 125 and 126 on the scan stage side transmission mark plate 32. Then, while minutely changing the position in the scan direction, about the thus determined position, and, additionally, while changing the position in the focus direction, the outputs of the light quantity detecting portions 111 and 112 are detected.

With this operation, in a similar manner as the case of detection of the position of the projected image of the reticle side transmission marks 102 and detection of the image plane, the position of the projected image of the reticle-associated marks 161 and 162 and the image plane are detected. It differs from the case of detection of the position of the projected image of the reticle side transmission marks 102 and detection of the image plane, in the following two points:

(i) The measurement is executed in the stationary state; and (ii) Only two light quantity detecting portions are used.

With the operations described above, the position of the projected image of the reticle side transmission marks, the position of the projected image of the reticle-associated marks 161 and 162 with respect to the image plane, and the relative position of the image plane are specified.

This relative position is called "base line" between the projection optical system 13 and the alignment microscope 30.

The procedure described in Items (1)–(6) can be performed automatically before start of or during the wafer process, in response to input of a system calibration command from an operator.

(7) Wafer Loading:

Referring back to FIG. 1, the exposure apparatus of this embodiment performs the wafer loading as follows. In response to input of a wafer process start command, a wafer is automatically taken out of a wafer carrier within a wafer conveying system (not shown). At a prealignment mechanical portion within the wafer conveying system, the wafer is placed on an X—Y stage. By using the wafer edge detecting function thereof, the outside peripheral shape of the wafer as well as its orientation flat are detected. Then, by using an X—Y—θ stage, the orientation flat of the wafer is aligned in a predetermined direction, and the center position of the wafer is determined. Thereafter, by using a focus detecting function, the level (height) of the surface of the wafer is detected.

After this, a prealignment mark of the wafer is placed below a microscope which is disposed at the top of the prealignment system, so that the position of the prealignment mark is measured. Then, the X—Y—θ stage is driven so that the position of the pattern of the wafer is brought into a predetermined positional relationship with a particular reference position of the conveying system.

Subsequently, wafer thickness information produced on the basis of the wafer level detection is supplied to the central processing unit (CPU) 70 of the exposure apparatus.

In response to reception of this information, the CPU 70 of the exposure apparatus actuates the Z drive mechanism of the θZ tilt stage to change the level (height) of the wafer chuck, so that, when the wafer is placed thereon, the wafer surface is positioned substantially at the focus position of the projection system and the alignment microscope.

After the operation described above, the conveying system moves the wafer from the X—Y—θ stage of the conveying system onto the wafer chuck of the exposure apparatus, by using a loading hand.

(8) Wafer Position Detection:

As the wafer 14 is loaded on the wafer chuck 15, the Y stage 18 and the scan stage 17 are actuated to move the wafer 14 to below the projection system 13, where the level measurement to the whole wafer surface is performed by using the focus detection system 25 and 26.

Subsequently, predetermined ones of chip regions of the wafer are moved to below the alignment microscope, sequentially, and position measurement is performed to alignment marks formed in each chip region.

The position measurement to the alignment marks is performed by projecting, onto the wafer, the transmission mark portion 160 and the reticle-associated marks 161 and 162 of the reference mark 150 within the alignment microscope 30. Here, the light passed through the transmission mark portion 160 is used to illuminate the alignment marks of the wafer 14. Thus, upon the CCD camera 31, the reticle-associated marks 161 and 162 and the alignment marks of the wafer 14 are projected.

With this measurement, the relative position of each chip of the wafer with respect to the reticle-associated marks 161 and 162 within the alignment microscope, as well as the magnification in the scan direction of each chip and in the direction perpendicular to the scan direction are determined.

With the operation described above, how during the exposure process to each chip of the wafer the relative position of the scan stage, the Y stage position and the magnification adjusting mechanism should be corrected and actuated in a timed relation with the scan motion, is determined.

The data to be used in such correction and actuation is correction data to the wafer as viewed from the reticle-associated marks 161 and 162 in the alignment microscope 30. Thus, hereinafter it will be referred to also as "correction data to the wafer".

(9) Scan Exposure:

On the basis of the correction data to the reticle, the base line and the correction data to the wafer as described above, during the scan exposure process, the reticle and the whole surface of each chip of the wafer can be accurately registered and focus-adjusted.

After completion of measurement of the correction data to the wafer, a first chip of the wafer 14 is moved to below the projection system 13 on the basis of the correction data to the reticle, the base line and the correction data to the wafer. Then, while retaining the idealistic relative position of the particular chip to the reticle and retaining the idealistic image plane position by using the the correction data to the reticle and the correction data to the wafer, and additionally while performing the mutual magnification correction, the reticle stage 7 and the scan stage 17 start the actual exposure scan operation.

In the exposure apparatus of this embodiment, the exposure amount of the wafer 14 is preset. In order to realize this exposure amount, it is necessary to detect the light energy by one pulse of the excimer laser 1 which is the light source.

In this embodiment, before start of the wafer process, the excimer laser is excited, and the illuminance on the reticle surface which corresponds to the illuminance on the wafer surface is measured by using the photosensor 4. On basis of the measurement, the number of necessary exposure light pulses as required to the whole area on the wafer is calculated.

From the thus calculated necessary exposure light pulse number, before start of the exposure scan the CPU 70 sets in the energization controller 40 the scan stage positions where the excimer laser is to be excited. During the exposure scan operation, the exposure controller 40 continuously monitors the position of the scan stage 17, and, each time the scan stage 17 reaches a preset scan stage position where the laser should be excited, it applies an excitement command signal to the excimer laser 1, by which the excimer laser is excited to produce pulse light.

With the operation described above, the exposure of one chip is completed. Similar operations are performed to all the remaining chips on the same wafer.

(10) Wafer Unloading:

After exposures of all the chips are completed, the wafer 14 is moved to the wafer unloading position by means of the Y stage 18 and the scan stage 17. Then, the wafer 14 is unloaded from the wafer chuck 15 by using an unloading hand (not shown) of the conveying system.

[Modifications]

The embodiment of the present invention as described hereinbefore may be modified as follows.

(1) Plurality of wafer side transmission marks and light quantity sensors:

A plurality of wafer side transmission marks and a plurality of light quantity sensors may be disposed around the wafer chuck. This enables exact correction of a difference in attitude.

(2) Test reticle:

There are cases where it is practically impossible to form a number of reticle side transmission marks on an actual reticle, to be used for manufacture of actual semiconductor devices, this being attributable to the relation with alignment patterns or other patterns. In order to meet this, a test reticle in which a number of reticle side transmission marks may be prepared to perform precise correction periodically. An actual reticle may thus be formed with a small number of reticle side transmission marks.

(3) Integral structure of transmission mark and light quantity sensor:

A large number of tilt transmission marks may be provided on the reticle and the scan stage, as in the preceding embodiment, and a light quantity sensor may be fixedly mounted below the scan stage side transmission marks. This enables that the scan stage side transmission marks are imaged upon the light receiving surface of the light quantity sensor, constantly in the same focus state. Also, it enables high precision detection of the reticle image plane position. In this method, however, it is necessary to dispose a long light quantity sensor having uniform detection sensitivity below the scan stage side transmission marks. Thus, if a high-speed pulse light source such as an excimer laser is used as a light source, generally it is difficult to satisfy the requirement of sensitivity uniformness by the sensor singly. This necessitates calibration of the sensitivity of the light quantity sensor. As a practical example therefor, while in the exposure apparatus the reticle is held in stationary state, the light quantity which enters the scan stage side transmission marks is made and kept uniform. While retaining this state, a detection unit which comprises an integral structure of scan stage side transmission marks and light quantity sensor is moved. Changes in the output of the light quantity sensor during this motion are memorized as calibration data, which may be used for calibration of the output data of the light quantity sensor during detection of the position of an actual reticle or detection of the image plane thereof. If however the light energy from the light source does not have a high stability, it is necessary to measure the light energy of the light source by using a reticle surface illuminance detection system such as described with reference to the preceding embodiment, to thereby correct the calibration data.

Next, an embodiment of device manufacturing method which uses an exposure apparatus such as described hereinbefore, will be explained.

FIG. 13 is a flow chart of the sequence of manufacturing a microdevice such as a semiconductor chip (e.g. IC or LSI), a liquid crystal panel, a CCD, a thin film magnetic head or a micro-machine, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check durability check and so on of the semiconductor devices produced by step 5 are carried out. With these processes, semiconductor devices are finished and they are shipped (step 7).

FIG. 14 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A scan type exposure apparatus, comprising:

a first movable stage for carrying a first object thereon and being movable in a predetermined one-dimensional direction;

a second movable stage for carrying a second object thereon and being movable in a predetermined one-dimensional direction;

a projection system for projecting a pattern of the first object onto the second object through a projection optical system while scanningly moving said first and second movable stages in a timed relation, relative to said projection optical system;

a first mark formed on the first object and including a plurality of marks arrayed along a scan direction;

a reference plate fixedly mounted on said second movable stage and having a second mark including a plurality of marks arrayed along the scan direction;

a third movable stage for carrying said second movable stage thereon and being movable in a direction different from the movement direction of said second stage;

a photodetector fixedly mounted on said third movable stage; and control means having a first function for moving said second and third movable stages so as to place said reference plate and said photodetector at a position of an image of the first mark as projected by said projection optical system and a second function for detecting the image of the first mark through the second mark by using said photodetector while moving said first and second movable stages in a timed relation, relative to said projection optical system.

2. An apparatus according to claim 1, wherein said second movable stage includes displaceable means being displaceable in a direction of an optical axis of said projection optical system, and wherein said control means is operable to actuate said displaceable means to change the position of said reference plate with respect to the optical axis direction so that said photodetector detects the image of the first mark through the second mark.

3. An apparatus according to claim 1, wherein each of the first and second marks comprises a mark including a plurality of marks arrayed periodically.

4. An apparatus according to claim 1, wherein each of the first and second marks comprises a mark including a plurality of marks having different inclinations.

5. An apparatus according to claim 1, wherein said control means determines the position where the first mark is to be projected upon the second mark through said projection optical system, on the basis of a signal responsive to the detection, by said photodetector, of the image of the first mark through the second mark and on the basis of the positions of said first and second movable stages at the time as said signal is detected.

6. An apparatus according to claim 2, wherein said control means determines the position in the optical axis direction of said projection optical system where the first mark is to be imaged through said projection optical system, on the basis of a signal responsive to the detection, by said photodetector, of the image of the first mark through the second mark and on the basis of the position of the second movable stage as said signal is detected.

7. An exposure method usable with a scan type exposure apparatus for projecting a pattern of a first object onto a second object through a projection optical system while scanningly moving the first and second objects in a timed relation, relative to the projection optical system, said method comprising the steps of:

providing, on the first object, a first mark including a plurality of marks arrayed along a scan direction;

providing a reference plate fixedly mounted on a movable stage for carrying the second object thereon, and having a second mark including a plurality of marks arrayed along the scan direction;

placing a photodetector at a position where an image of the first mark is projected or to be projected by the projection optical system; and detecting the image of the first mark through the second mark by using the photodetector while scanningly moving the first object and the reference plate in a timed relation, relative to the projection optical system.

8. A method according to claim 7, wherein, in said detecting step, the image of the first mark is detected through the second mark by using the photodetector while changing the position of the reference plate with respect to the optical axis direction of the projection optical system.

9. A method according to claim 8, further comprising determining the position where the first mark is projected or to be projected upon the second mark by the projection optical system, on the basis of the positions of the first and second marks at a time as the image of the first mark is detected through the second mark by using the photodetector.

10. A method according to claim 8, further comprising determining the position, with respect to the optical axis direction, where the first mark is imaged by through the projection optical system, on the basis of a signal responsive to the detection of the image of the first mark through the second mark by using the photodetector and on the basis of the position of the reference place with respect to the optical axis direction at a time as the signal is detected.

11. A device manufacturing method usable with a scan type exposure apparatus for projecting a pattern of a reticle onto a wafer through a projection optical system while scanningly moving the reticle and the wafer in a timed relation, relative to the projection optical system, said method comprising the steps of:

providing, on the reticle, a reticle mark including a plurality of marks arrayed along a scan direction;

providing a reference plate fixedly mounted on a movable stage for carrying the wafer thereon, and having a wafer mark including a plurality of marks arrayed along the scan direction;

placing a photodetector at a position where an image of the reticle mark is projected or to be projected by the projection optical system; and detecting the image of the reticle mark through the wafer mark by using the photodetector while scanningly moving the reticle and the reference plate in a timed relation, relative to the projection optical system.

* * * * *

UNITED STATES PATENT AND TRADEMARK OFFICE
CERTIFICATE OF CORRECTION

PATENT NO.  : 5,753,926

DATED       : May 19, 1998

INVENTOR    : MITSUYA SATO

It is certified that error appears in the above-identified patent and that said Letters Patent is hereby corrected as shown below:

ON THE COVER PAGE:

Before item [51], insert

--[30]      Foreign Application Priority Data
   April 25, 1995   [JP]   Japan ................. 7-101234--.

IN THE DRAWINGS:

On sheet 10, In "FIG. 14," at "STEP 13", "ELCTRODE" should read --ELECTRODE--.

COLUMN 1:

line 12, "of" should read --of a--;
    line 21, "for" should read --for an--;
    line 45, "where" should read --wherein--;
    line 52, "cases" should read --cases,--;
    line 53, "(e.g.," should read --(e.g., a-- and "or" should read --or an--;
    line 55, "wave length," should read --wavelength,--;
    line 57, "laser" should read --lasers-- and "has" should read --have--;
    line 60, "during" should read --during an--; and
    line 67, "such" should read --such a--.

UNITED STATES PATENT AND TRADEMARK OFFICE
CERTIFICATE OF CORRECTION

PATENT NO. : 5,753,926

DATED : May 19, 1998

INVENTOR : MITSUYA SATO

It is certified that error appears in the above-identified patent and that said Letters Patent is hereby corrected as shown below:

COLUMN 2:

line 11, "in" (second occurrence) should read --with--;
    line 14, "of" should read --of an--;
    line 27, "in" should read --in a--;
    line 28, "in" should read --in the--; and
    line 40, "in" should read --in a--.

COLUMN 3:

line 34, "as" should be deleted.

COLUMN 4:

line 6, "as" should read --that--;
    line 15, "place" should read --plate--;
    line 16, "as" should be deleted;
    line 42, "showing" should read --showing a--;
    line 54, "manner" should read --manner of--;
    line 57, "manner" should read --manner of--; and
    line 60, "detections" should read --detection,--.

UNITED STATES PATENT AND TRADEMARK OFFICE
CERTIFICATE OF CORRECTION

PATENT NO. : 5,753,926

DATED : May 19, 1998

INVENTOR : MITSUYA SATO

It is certified that error appears in the above-identified patent and that said Letters Patent is hereby corrected as shown below:

COLUMN 5:

line 19, "FIG. 1" should read --FIG. 1,--.

COLUMN 7:

line 28, the right margin should be closed up;
    line 29, the left margin should be closed up;
    line 58, "and" should read --and,--; and
    line 59, "B" should read --B,--.

COLUMN 8:

line 11, "where" should read --wherein--;
    line 13, "In" should read --On--;
    line 31, "in" should read --with--; and
    line 67, "of" should read --of a--.

COLUMN 9:

line 2, "of" should read --of the--;

UNITED STATES PATENT AND TRADEMARK OFFICE
CERTIFICATE OF CORRECTION

PATENT NO. : 5,753,926

DATED : May 19, 1998

INVENTOR : MITSUYA SATO

It is certified that error appears in the above-identified patent and that said Letters Patent is hereby corrected as shown below:

COLUMN 9: (cont'd)

line 5, "$L_{2-L4}$" should read --$L_2-L_4$--;
    line 13, "of" (first occurrence) should read --on--; and
    line 15, "of" (first occurrence) should read --on--.

COLUMN 10:

line 47, "it" should read --it also--;
    line 48, "also" should be deleted; and
    line 49, "the" (second occurrence) should read --a--.

COLUMN 11:

line 12, "162" should read --162,--; and
    line 46, "before" should read --before a--.

COLUMN 12:

line 39, "direction" should read --direction,--;
    line 40, "how" should read --how,--;

UNITED STATES PATENT AND TRADEMARK OFFICE
CERTIFICATE OF CORRECTION

PATENT NO. : 5,753,926

DATED : May 19, 1998

INVENTOR : MITSUYA SATO

It is certified that error appears in the above-identified patent and that said Letters Patent is hereby corrected as shown below:

COLUMN 12: (cont'd)

line 44, "is" should read --are--;
    line 49, "it" should read --it also-- and after "to", "also" should be deleted;
    line 63, "the" (second occurrence) should be deleted; and
    line 64, "additionally" should read --additionally,--.

COLUMN 13:

line 4, "1" should read --1,--;
    line 5, "before" should read --before a--;
    line 10, "to" should read --for--;
    line 13, "before" should read --before a-- and "scan" should read --scan,--; and
    line 56, "that" should be deleted and "are" should read --to be--.

COLUMN 14:

line 1, "in" should read --in a--;

UNITED STATES PATENT AND TRADEMARK OFFICE
CERTIFICATE OF CORRECTION

PATENT NO. : 5,753,926

DATED : May 19, 1998

INVENTOR : MITSUYA SATO

It is certified that error appears in the above-identified patent and that said Letters Patent is hereby corrected as shown below:

COLUMN 14: (cont'd)

```
    line 4, "unit" should read --unit,--;
    line 5, "sensor" should read --sensor,--;
    line 9, "If however" should read --If, however,--;
    line 15, "of" should read --of a--;
    line 19, "(e.g. IC or LSI)," should read --(e.g.,
an IC or an LSI),--;
    line 32, "wherein" should read --wherein an--; and
    line 33, "check" should read --check, a--.
```

COLUMN 15:

```
    line 47, "as" should be deleted.
```

UNITED STATES PATENT AND TRADEMARK OFFICE
CERTIFICATE OF CORRECTION

PATENT NO. : 5,753,926

DATED : May 19, 1998

INVENTOR : MITSUYA SATO

It is certified that error appears in the above-identified patent and that said Letters Patent is hereby corrected as shown below:

COLUMN 16:

line 26, "as" should be deleted;
    line 31, "by" should be deleted;
    line 35, "place" should read --plate--; and
    line 36, "as" should be deleted.

Signed and Sealed this

Fifth Day of January, 1999

*Attest:*

*Attesting Officer*      Acting Commissioner of Patents and Trademarks